(12) United States Patent
Grann

(10) Patent No.: US 6,201,908 B1
(45) Date of Patent: Mar. 13, 2001

(54) OPTICAL WAVELENGTH DIVISION MULTIPLEXER/DEMULTIPLEXER HAVING PREFORMED PASSIVELY ALIGNED OPTICS

(75) Inventor: Eric B. Grann, San Ramon, CA (US)

(73) Assignee: Blaze Network Products, Inc., Dublin, CA (US)

( * ) Notice: Subject to any disclaimer, the term of this patent is extended or adjusted under 35 U.S.C. 154(b) by 0 days.

(21) Appl. No.: 09/347,490

(22) Filed: Jul. 2, 1999

(51) Int. Cl.[7] .................................................. G02B 6/293
(52) U.S. Cl. ................................ 385/24; 359/127; 385/33; 385/47
(58) Field of Search ................................ 385/14, 15, 24, 385/34, 33, 39, 47, 51, 52; 359/115, 124–127, 131, 137

(56) References Cited

U.S. PATENT DOCUMENTS

| | | | |
|---|---|---|---|
| 4,244,045 | * | 1/1981 | Nosu et al. ............................ 359/129 |
| 4,824,200 | * | 4/1989 | Isono et al. ............................. 385/24 |
| 5,119,454 | * | 6/1992 | McMahon ............................... 385/49 |
| 5,583,683 | * | 12/1996 | Scobey ................................... 359/127 |
| 5,786,915 | * | 7/1998 | Scobey ................................... 359/127 |
| 5,835,517 | * | 11/1998 | Jayaraman et al. ..................... 372/50 |
| 5,859,717 | * | 1/1999 | Scobey et al. ......................... 359/124 |
| 5,894,535 | * | 4/1999 | Lemoff et al. .......................... 385/47 |
| 6,118,912 | * | 9/2000 | Xu .......................................... 385/24 |
| 6,122,417 | * | 9/2000 | Jayaraman et al. ..................... 385/24 |

FOREIGN PATENT DOCUMENTS

08082711 * 3/1996 (JP).

* cited by examiner

*Primary Examiner*—John D. Lee
*Assistant Examiner*—Michelle R. Connelly-Cushwa
(74) *Attorney, Agent, or Firm*—Bruce H. Johnsonbaugh

(57) ABSTRACT

An optical wavelength division multiplexer and de-multiplexer for single mode or multi-mode fiber optic communication systems is provided. The device includes in its preferred embodiment a prefabricated optical block having a reflective coating on its flat upper surface and a plurality of n filters carried on its flat lower surface. A molded plastic coupling module has a flat upper surface to which the optical block and filters are adhesively mounted and the coupling module also includes a lower surface having a plurality of n aspheric lenses. In the preferred embodiment, a fiber optic cable receptacle is molded to the coupling module along with a collimating lens and a beam reflector so that, when the components are assembled, the optical pathway is passively aligned and no postfabrication alignment adjusting or tuning is required.

14 Claims, 7 Drawing Sheets

OPTICAL WAVELENGTH DIVISION MULTIPLEXER/DEMULTIPLEXER HAVING PREFORMED PASSIVELY ALIGNED OPTICS

BACKGROUND AND BRIEF SUMMARY OF INVENTION

The present invention pertains to optical communications. More particularly, this invention relates to an optical multiplexing device with passively aligned molded optics which spatially disperses collimated multi-wavelength light from an optical fiber into individual wavelength bands. In certain preferred embodiments, the improved multiplexing device of the present invention is particularly suited for wavelength division multiplexing systems for the fiber optic datacommunications and telecommunications systems.

In wavelength division multiplexed optical communication systems, many different optical wavelength carriers provide independent communication channels in a single optical fiber. Future computation and communication systems place ever-increasing demands upon communication link bandwidth. It is generally known that optical fibers offer much higher bandwidth than conventional coaxial communications; furthermore, a single optical channel in a fiber waveguide uses a microscopically small fraction of the available bandwidth of the fiber (typically a few GHz out of several tens of THz). By transmitting several channels at different optical wavelengths into a fiber [i.e., wavelength division multiplexing (WDM)], this bandwidth may be more efficiently utilized.

Prior art optical multiplexers and demultiplexers include the Nosu et al U.S. Pat. No. 4,244,045. Nosu utilizes a series of wavelength sensitive filters arranged in a zigzag optical pathway at a predetermined oblique angle to the light beam. Nosu positions filters on both sides of substrate 60. It is significant that the fabrication of the Nosu device is expensive and time consuming. As described at column 4, lines 33–52, the multi-layer filters are separately grown on the substrate and have as many as ten layers each. The couplers and lenses must be separately aligned in a tedious, expensive post-fabrication process.

The Scobey U.S. Pat. Nos. 5,583,683 and 5,786,915 teach an eight channel multiplexing device in which a continuous variable thickness interference filter is deposited onto the surface of an optical block. This design has inherent weaknesses. First, each filter must necessarily integrate the signal over its width, since its thickness (and wavelength sensitivity) varies across its width; resulting in less precise filtering. Secondly, the interference filter thickness may vary from device to device, also degrading its filtering performance. Thirdly, each of the individual couplers such as item 62 of FIG. 3 must be separately aligned after fabrication.

The Scobey et al U.S. Pat. No. 5,859,717 teaches the use of a precision optical block which is opaque (col. 4, lines 20–29) and in which slots or gaps are machined or formed to provide an optical path. Any machining required adds to the expense of producing the recesses, gaps and slots. Furthermore, the separate collimators (6,24,46) and filters 32 must be separately aligned after fabrication of the device, adding to the time and expense of production.

The Jayaraman U.S. Pat. No. 5,835,517 teaches an optical multiplexer having multiple optical cavities which must each be "tuned" after fabrication by adjusting its length. Such "tuning" adds significantly to cost of production, and is expressly avoided with the present invention.

The Lemoff et al U.S. Pat. 5,894,535 teaches an optical multiplexer in which a plurality of dielectric channel waveguides are embedded in a cladding region, which process is considerably more expensive than the monolithic formed parts of the present invention. Furthermore, the filters must be separately aligned with the channel waveguides after fabrication. Perhaps the greatest inherent disadvantage of the Lemoff et al design is the difficulty, expense and time of mounting the mirror 36 in channel 50 and properly mounting the filters 45a through 45d. The channel 50 and the filter mounting surface must be cut with an expensive excimer laser or microtome, yielding a relatively rough mounting surface. The rough mounting surface creates bonding and alignment problems. The filters, for example, are angularly sensitive and must be mounted precisely vertically and parallel with each other as shown in FIG. 3. Additionally, since the waveguides are so broad, the waveguides have large angular content, which causes a "rolled off" or variable filter response. The present invention avoids the bonding and alignment problems of Lemoff et al as well as the variable filter response. The present invention uses preformed and/or premolded extremely flat surfaces for carrying the reflective mirror surface and the filters, so that the mirror and filters are properly bonded and aligned. The present invention has much smaller divergence which, together with proper filter alignment, results in much cleaner separation of the n wavelength beams by the filters.

An optical multiplexing device combines or separates multiple light signals with varying optical frequencies. The optical multiplexing device has applications for both dense and coarse wavelength division multiplexing (DWDM and CWDM) for both multi-mode and signal-mode fiber optic data communications and telecommunications. Multiple wavelength light sources are combined into a single optical path for transmission or multi-wavelength light travelling in a single optical path is separated into multiple narrow spectral bands that is focused onto individual fiber optic carriers or detectors.

Current wavelength division multiplexed (WDM) devices are designed for operation in single-mode optical fiber telecommunications systems, where performance over long distances (100 km) is the primary factor and cost and size are secondary. As bandwidth demands within the Networking Industry [Local Area Networks (LAN) and Wide Area Networks (WAN)] increase, compact inexpensive wavelength division multiplexed systems will become necessary in order to utilize the full bandwidth of the optical fiber. The WDM device described herein utilizes plastic-mold injection and inexpensive dielectric filters to create a compact device capable of multiplexing or demultiplexing multiple optical wavelengths.

One of the key features and a primary object of the present invention is to provide a compact and cost effective optical multiplexer and demultiplexer for both single-mode or multi-mode fiber optic communication systems wherein the device includes preformed and premolded passively aligned optics.

A further object of the invention is to provide an optical multiplexer/demultiplexer having only two preformed parts and a series of filters, the filters being sandwiched between the preformed parts.

Another feature of the present invention is to minimize optical loss due to divergence of light between the source coupling optics and the fiber optic connector coupling optics.

Another feature of the present invention is to integrate a fiber optic connector within the optical module to passively align an optical fiber to the coupling optic.

A further feature of the present invention is to allow demultiplexed multi-wavelength light to couple directly to a photodetector array without any intervening optical fiber.

The present invention is comprised of a single plastic molded coupling module, a single precision optical block with a reflective coating on one side, an array of discrete multi-wavelength Fabry-Perot transmission filters in one embodiment, and index matching optical adhesive to bond said components together.

The plastic molded coupling module is formed by integrating an aspherical off-axis collimating lens array, filter mechanical alignment features, a redirectional mirror, a coupling lens, a fiber optic connector, and mechanical features for passive alignment of the optical part to either an array of light sources, a detector array, or an optical fiber array, all within a single part.

A precision optical block can be formed of any transparent optical material capable of transmitting light over the desired spectral region and being formed or polished to the correct thickness. A reflective surface can be placed on the optical block by a number of techniques, to include; dielectric interference coatings, metallic coatings, etc.

DETAILED DESCRIPTION OF THE DRAWINGS

Figure 5:
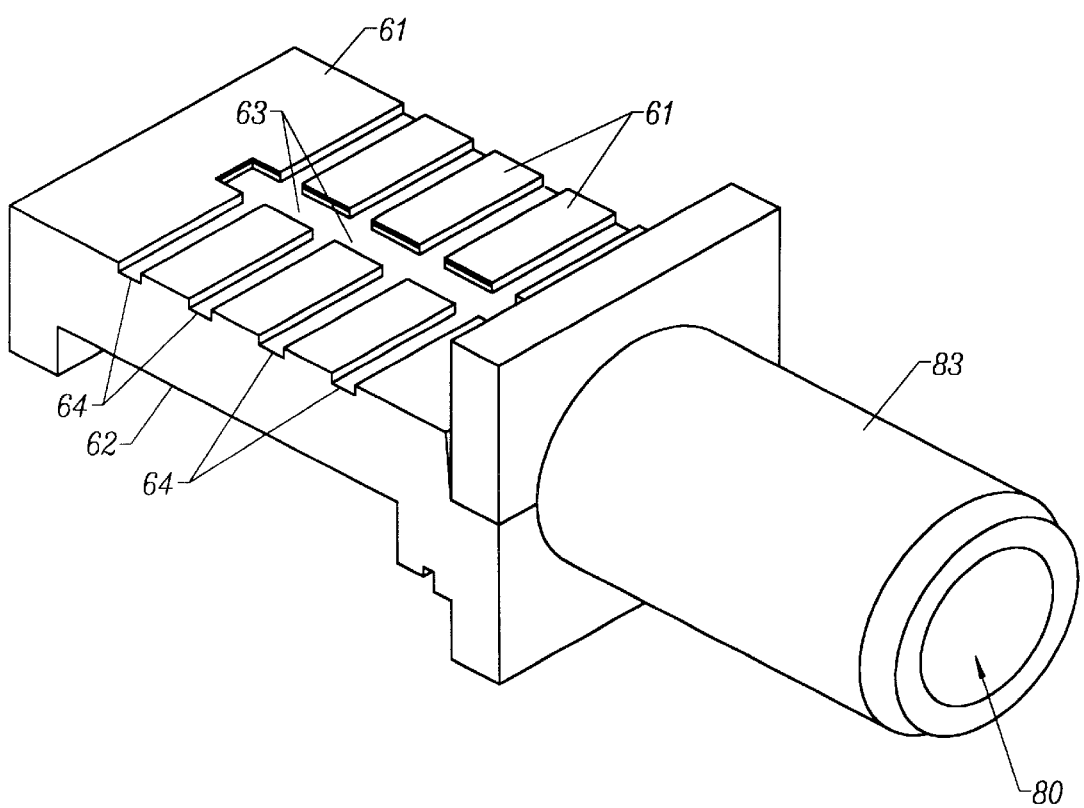
FIG. 5 shows an isometric top view of the plastic molded coupling device.
Figure 6:
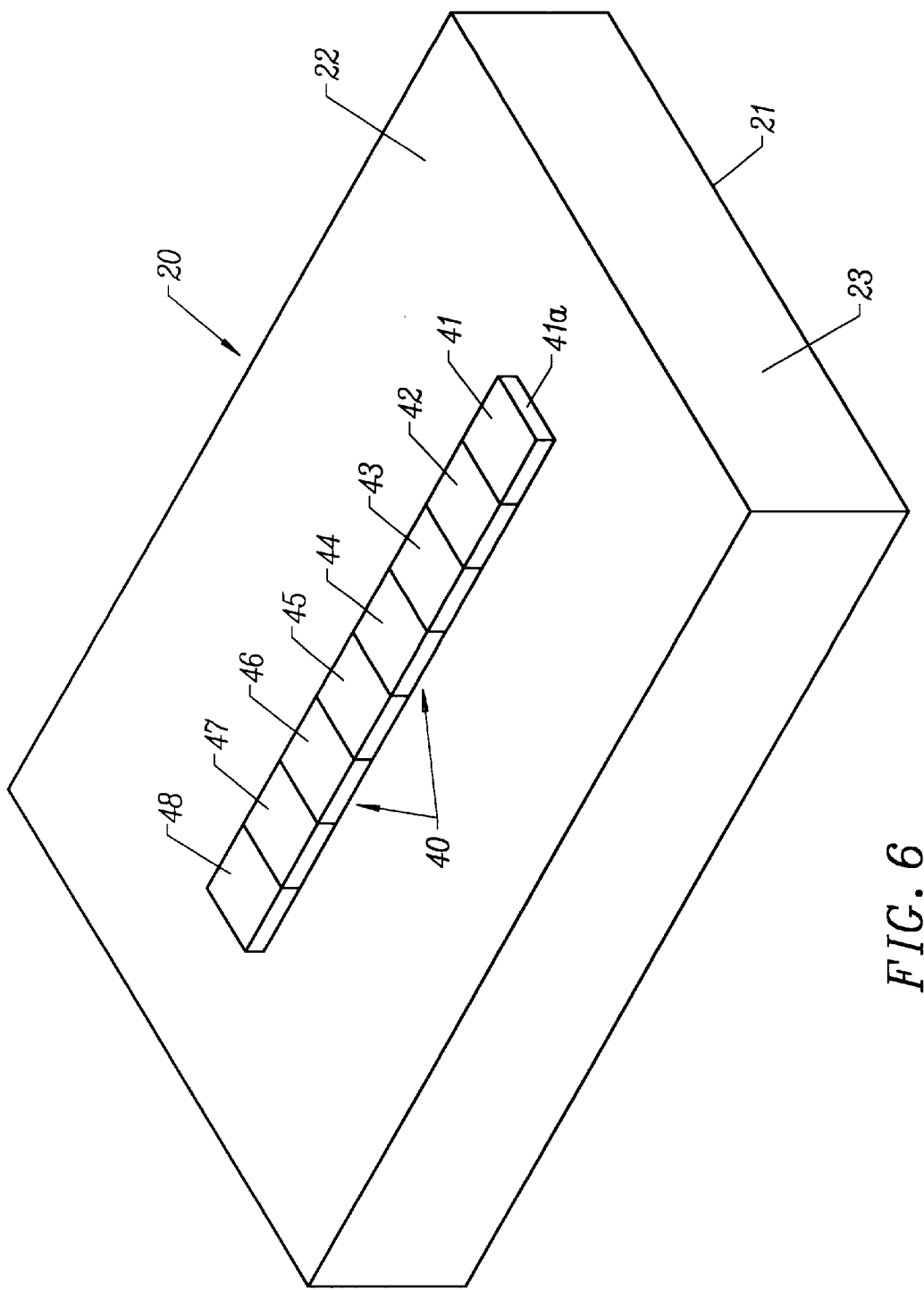
FIG. 6 shows an isometric bottom view of the multi-bounce precision optical block.
Figure 7:
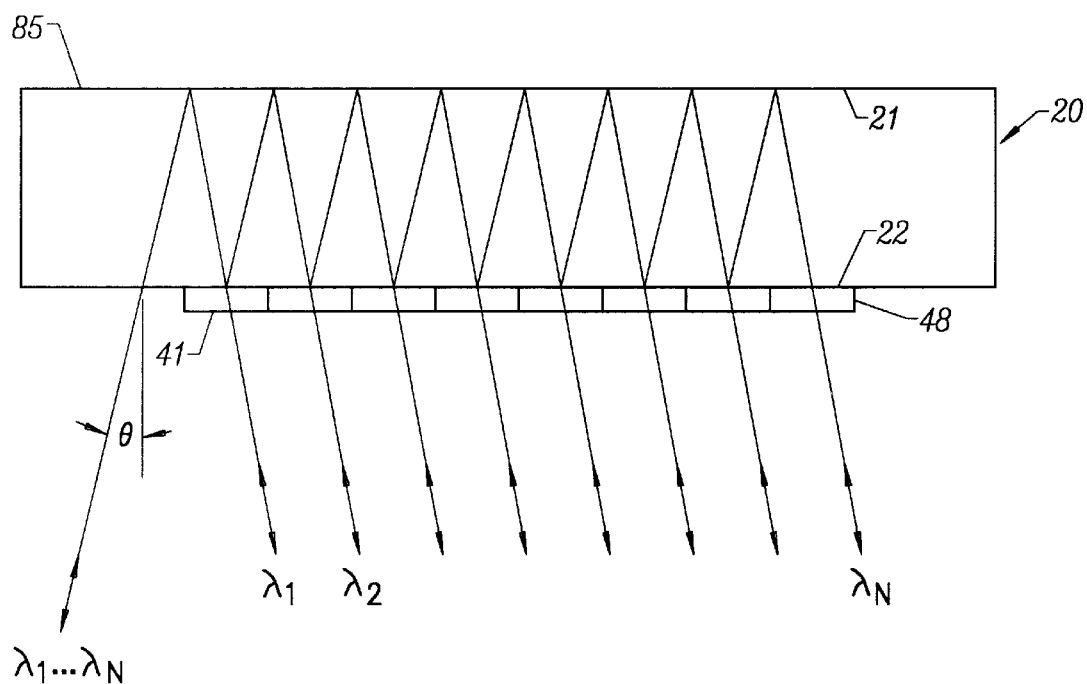
FIG. 7 shows a cross-sectional side view of the multi-bounce optical block.

FIGS. 1–4 show the assembled wavelength division multiplexer/demultiplexer according to the present invention. FIGS. 5–7 show important components of the multiplexer 10 prior to assembly. The invention has the ability to combine individual light signals into a single optical path which can be directed towards an optical fiber, and/or demultiplex such signals into individual channels. For simplicity of explanation, the demultiplexing functionality is described in detail, since those skilled in the art will readily understand the correlative multiplexing functionality.

Figure 1:
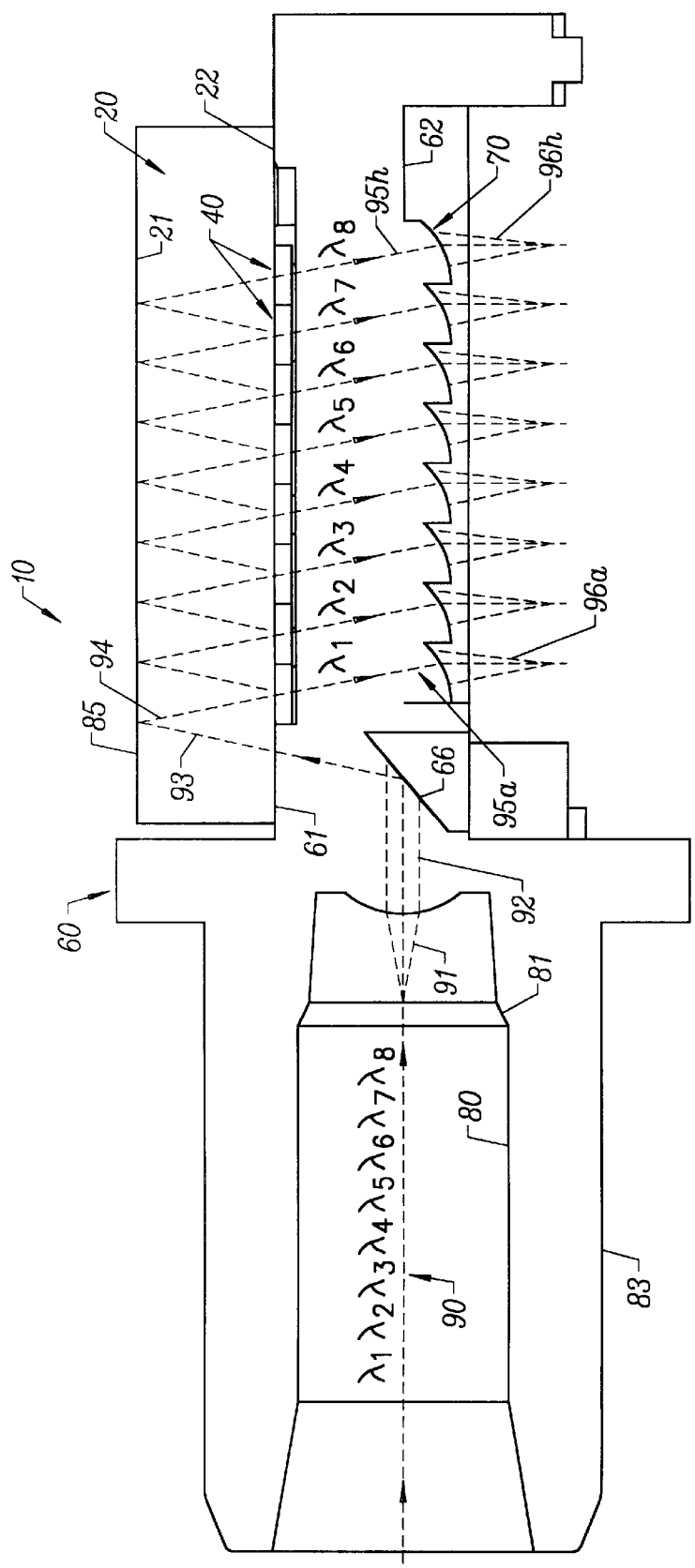
FIG. 1 shows a cross section side view of the entire WDM optical multiplexer/demultiplexer.

FIG. 1 shows the assembled primary components and illustrates the optical pathway 90–96 wherein an incoming signal includes eight separate wavelengths (n wavelengths in the general case), which are separated into eight separate channels to be read by photodetectors (not shown). An optical block 20 may either be formed of glass or molded of plastic is shown with a plurality of filters 40 carried on its lower surface 22. The optical block 20 has an upper flat surface 21 which is coated with a reflective material 85.

A molded coupling module 60 has a flat upper surface 61 which is adhesively connected to the flat lower surface 22 of optical block 20.

The molded coupling module 60 in the embodiment illustrated in FIG. 1 includes a fiber optic cable receptacle 80 integrally molded therein for receiving the end of a fiber optic cable (not shown) so that the end of the cable engages receptacle seat 81.

As illustrated in FIG. 1, a multiplexed optical beam moves along optical pathway 90, exits the end of the fiber optic cable (not shown) and begins to diverge as shown at 91. An integrally molded collimating lens 65 collimates the diverging light beam 91 and forms a collimated beam 92. The collimated light beam 92 is reflected off integrally formed reflective surface 66 of the molded coupling module 60 and is directed upwardly toward the reflective coating 85 carried by the flat upper surface 21 of the optical block 20. As the light beam moves through that section 93 of the optical pathway, it impinges against the reflective coating 85 at a predetermined angle of incidence as known in the art. The reflected beam 94 is reflected in a zigzag pattern in optical block 20 between the plurality of n filters 40 and the reflective surface 85 as is known in the art. As the reflected beam enters each of the n filters, one of the n different wavelengths of light is transmitted through each filter and the separated wavelengths move along the optical pathways 95a through 95h toward the plurality of molded aspheric surfaces 70 formed on the lower surface 62 of the molded coupling module 60. Each of the n aspheric molded surfaces focuses the separated wavelength bands or channels 96a–96h onto separate photodetectors (not shown), as known in the art.

Figure 2:
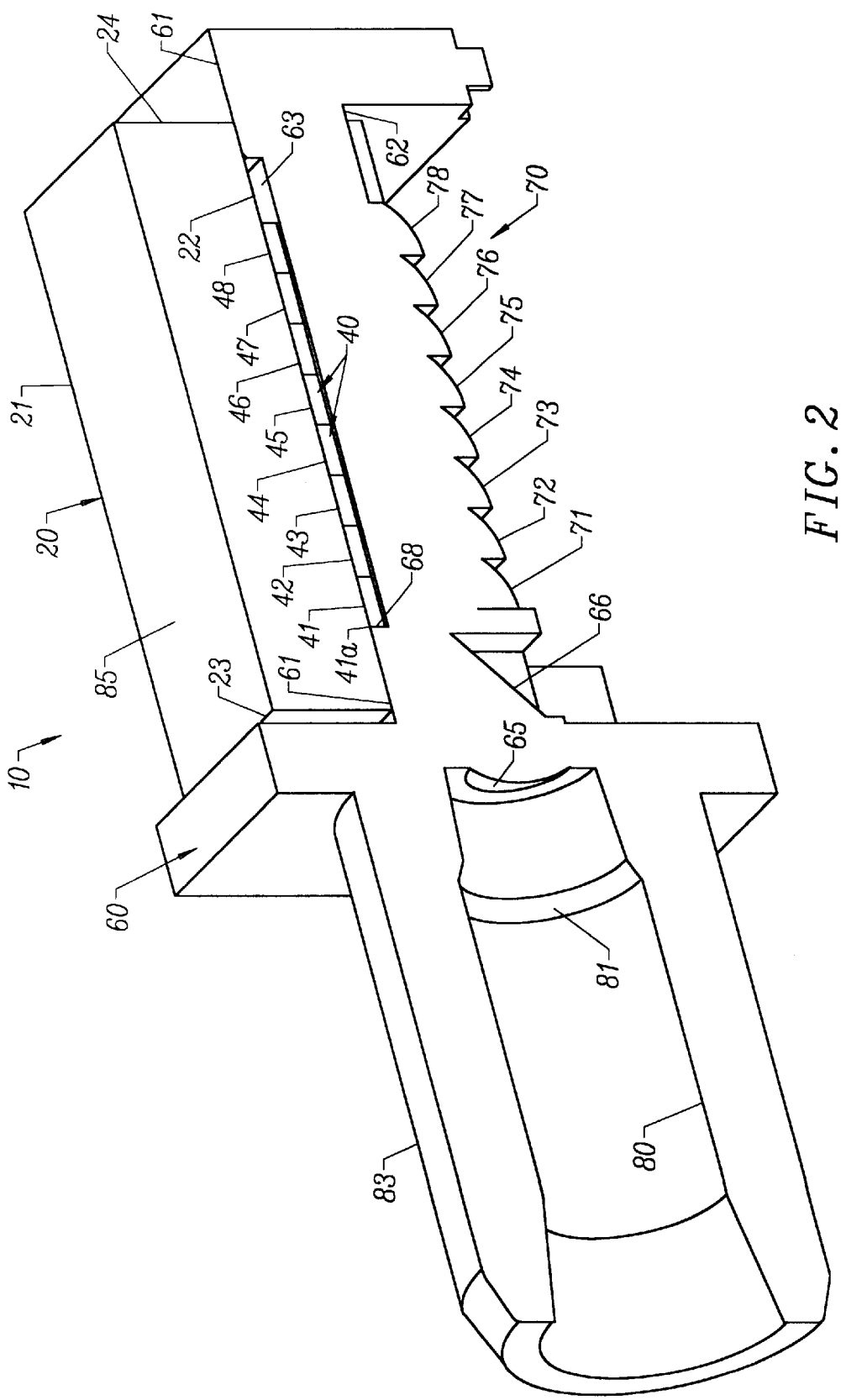
FIG. 2 shows a cross-sectional isometric side view of the entire WDM device.
Figure 3:
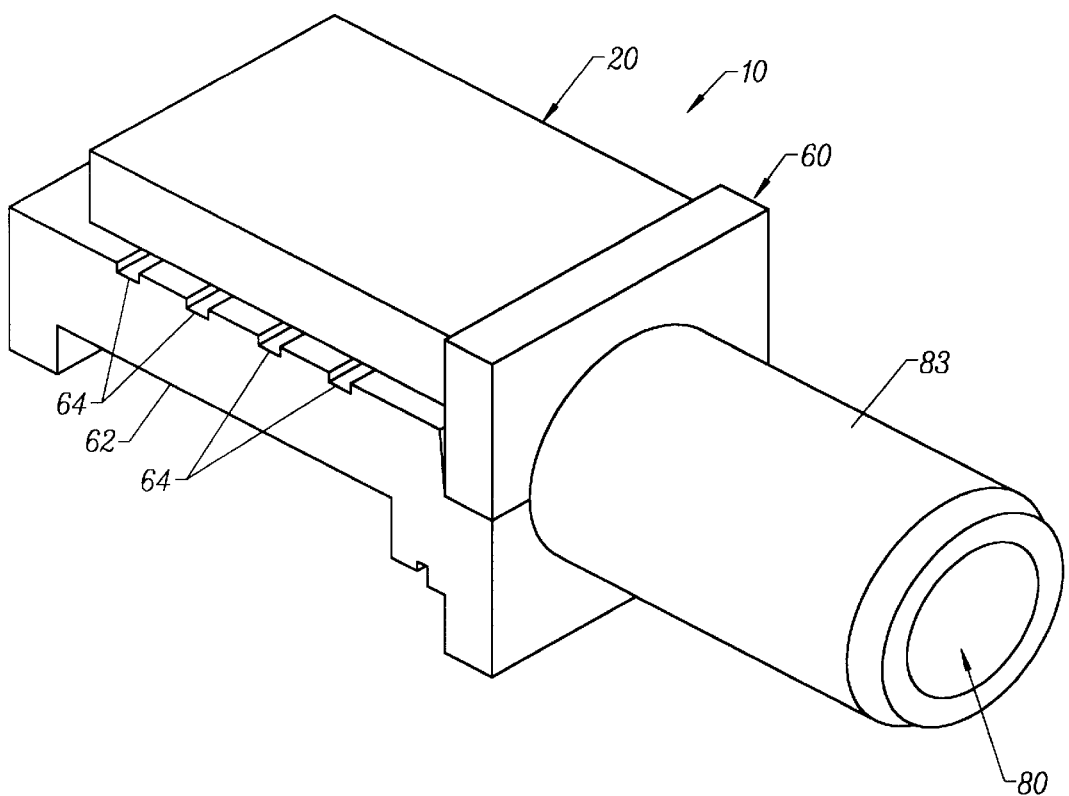
FIG. 3 shows an isometric top view of the entire WDM device.
Figure 4:
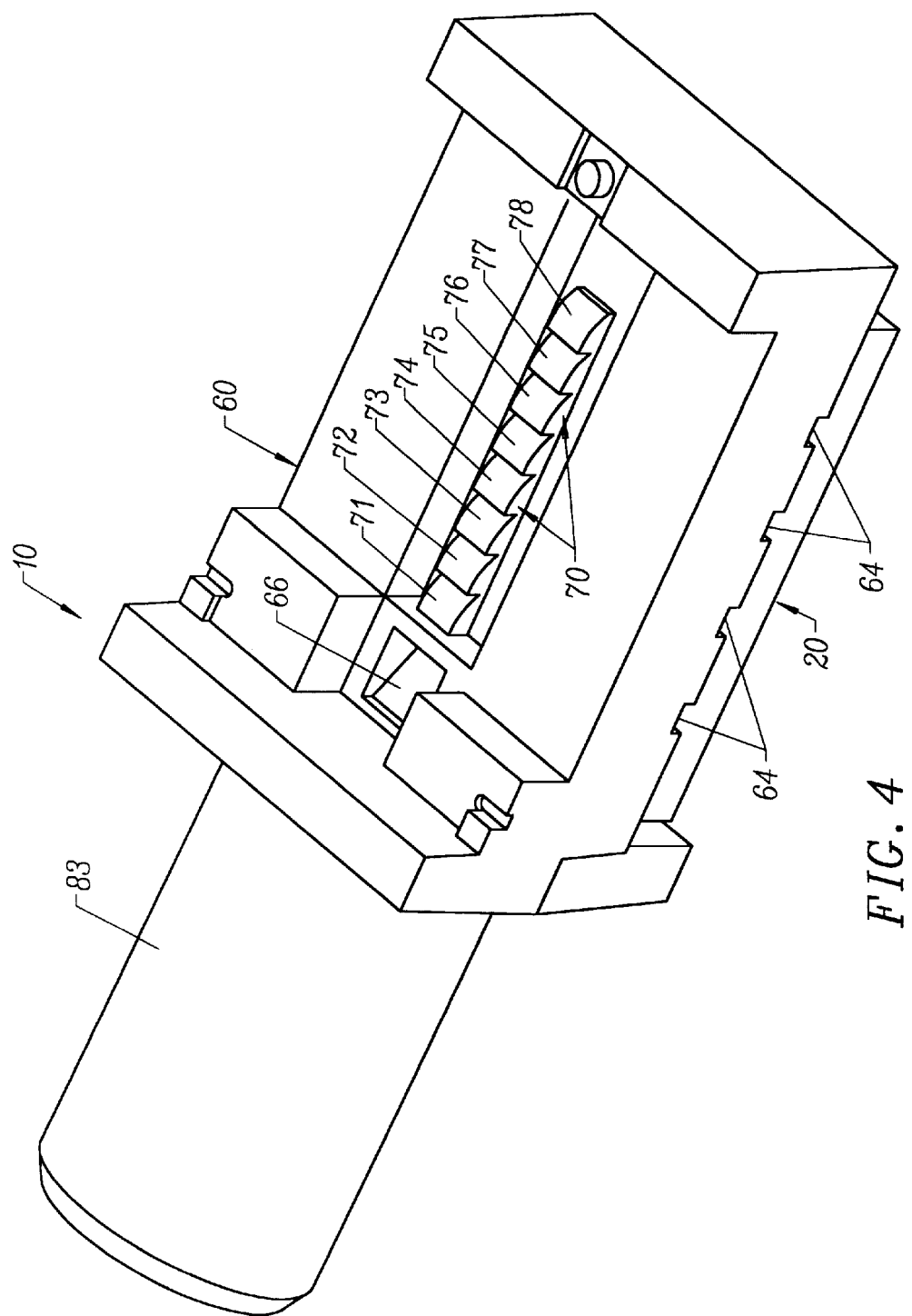
FIG. 4 shows an isometric bottom view of the entire WDM device.

For the sake of clarity, FIGS. 2–4 do not illustrate the optical pathway and the separation of the incoming multiplexed beam into separate readable wavelength bands As shown in FIG. 2, the optical block 20 is generally rectangular in shape having flat upper and lower surfaces 21 and 22, a flat proximal end wall 23 and a flat distal wall 24. The optical block in the preferred embodiment of the invention is formed from a high quality optical glass. Alternately, the optical block 20 may be injection molded using high quality optical plastic. The reflective coating 85 is applied to the upper surface 21 of block 20. The reflective coating may be formed of materials conventionally used in this art, such as dielectric interference coatings or metallic coatings.

The molded coupling module 60 is preferably injection molded and has a flat upper surface 61 (shown best in FIG. 5). It is important that surface 61 be as flat as possible to mate with the flat lower surface 22 of optical block 20. An alignment channel 63 is formed as a recess in the upper surface 61 of the molded coupling module 60. The purpose of alignment channel 63 is to receive the plurality of n filters 40. Alignment channel 63 is an elongated channel extending longitudinally along the center of upper surface 61 of molded coupling module 60.

As shown in FIG. 2, the proximal end 68 of alignment channel 63 forms a seat against which the plurality of filters 40 is placed, and acts as a filter registration surface.

As shown best in FIG. 5, a plurality of relief cuts 64 is molded in the upper surface 61 of molded coupling module 60 and the relief cuts 64 extend transversely from the alignment channel 63 to the outer surfaces of the molded coupling module 60. One purpose served by the relief cuts 64 is to cooperate with the alignment channel 63 when the optical block 20 is adhesively mounted on the molded coupling module 60. As the two parts are pressed together, the relief cuts 64 and the alignment channel 63 become filled with epoxy adhesive as the upper surface 61 becomes coated with adhesive and becomes bonded to the optical block 20 and the plurality of n filters 40.

The adhesive used has an index of refraction as close as possible to the index of refraction for the materials used in forming the optical block 20 and the molded coupling module 60.

The fiber optic cable receptacle 80 is formed in ferrule 83 and is capable of receiving the end of either single-mode or multi-mode fiber optic cable. The dimensions of receptacle 80 are designed to firmly seat the end of the optical cable in seat 81 and to support a sufficient length of the fiber optic cable so that the light beam 91 emanating from the fiber optic cable is optically aligned with collimating lens 65. Although the embodiment shown in FIGS. 1–4 shows the fiber optic cable receptacle molded integrally with the molded coupling module 60, it can be formed or molded separately of metal, ceramic, plastic, glass or any other suitable material. However, in the preferred embodiment shown in FIGS. 1–4, the fiber optic cable receptacle is molded integrally with the molded coupling module 60.

As shown best in FIG. 2, the collimating lens 65 and reflecting surface 66 are also molded integrally with molded coupling module 60. Reflective surface 66 is alternately referred to in the claims as a "beam reflecting means" and is formed with an angle which causes the collimated light beam 92 to be reflected onto the upper surface 21 of optical block 20 at a predetermined angle to cascade or zigzag between reflective surface 85 and the plurality of filters 41–48, all as is known in the art.

The plurality of n aspheric molded surfaces referred to generally as 70 formed on the lower surface of molded coupling module 60 includes eight separate aspheric lens surfaces 71–78. In the general case, there would be n aspheric surfaces interacting with n filters. The aspheric lens surfaces are formed directly beneath alignment channel 63 and the plurality of n filters 40. The surface of each of the aspheric lens 71–78 is of a surface design known in the art to focus a separated wavelength band as illustrated in FIG. 1 at a point at or near the surface of a photodetector element, as is also known in the art.

The plurality of n filters 40 as illustrated in FIG. 2 includes eight discrete Fabry-Perot filters 41–48 mounted adjacent each other on the flat bottom surface 22 of optical block 20, as shown best in FIG. 6. It is significant that each of the discrete filters 41–48 is seated against each other as they are adhesively connected to the bottom surface 22 of optical block 20. This method of placing the discrete Fabry-Perot filters adjacent each other on a known flat surface avoids many of the bonding and alignment problems in existing prior art wavelength division multiplexers. Additionally, the proximal end 41a of filter 41 is intended to contact the seat 68 or proximal surface of alignment channel 63 of the molded coupling module 60 so that the filter assembly will have the proper optical alignment with the aspheric lens array when the device has been assembled.

The assembly of the filter array onto the optical block and then the adhesive bonding of the optical block 20 to the molded coupling module 60 achieves a passive optical alignment of the critical optical elements of the device. When assembled as described above, the output beam 91 of the fiber optic cable is directly coupled to the wavelength division multiplexer/demultiplexer 10 and is automatically and passively aligned with the internal optics of the device, including the collimating lens 65, the beam reflection means, the reflective coating 85 on the top surface of optical block 20 as well as with the plurality of filters 40 and the plurality of aspheric surfaces 70. In contrast to the prior art, no postfabrication alignment or tuning or adjustment of these optical elements is required in the present invention.

Certain variations may be made without departing from the spirit of the invention. For example, as an alternative to using discrete dielectric Fabry-Perot filters, it is also possible to deposit the filters onto the lower surface of optical block 20 as is known in the art. In the preferred embodiment illustrated in the drawings, the fiber optic cable receptacle 80, the collimating lens 65 and beam reflecting means 66 are formed integrally in the molded coupling module 60, those optical elements could also be formed either in a separate third element or as part of the optical block 20. However, in the preferred embodiment, the optical block 20 is made of glass whereas the fiber optic cable receptacle collimating lens and beam reflecting means are preferably molded plastic.

What is claimed is:

1. An optical wavelength division multiplexer and demultiplexer for single mode or multi-mode fiber optic communication systems, wherein n channels are transmitted through a single fiber optic cable having n different wavelengths and wherein optical couplings, lenses and alignment of the device are achieved by forming and joining of prefabricated parts to avoid post-fabrication alignment and adjustment of the optical pathway otherwise required, comprising:

an optical block having a flat upper surface and a flat lower surface, a reflective coating carried by said upper surface of said optical block, a plurality of n filters carried on said flat lower surface of said optical block, said filters adapted to separately filter said n different wavelengths, a molded coupling module having a flat upper surface on which said flat lower surface of said optical block is mounted, said molded coupling module also having a lower surface on which a plurality of n aspheric lens surfaces is carried, wherein each of said n aspheric lenses is optically aligned with each of said n filters, a fiber optic cable receptacle for receiving the end of said fiber optic cable, a collimating lens optically aligned with said fiber optic cable receptacle, and beam reflecting means between said collimating lens and said flat upper surface of said molded coupling module to optically align said collimating lens with said plurality of n filters, whereby said n channels of light introduced through said fiber optic cable are reflected between said reflective coating on the upper surface of said optical block and said plurality of n filters, and wherein each of n channels passes through one of said filters and through one of said n aspheric lens surfaces.

2. The apparatus of claim 1 wherein said molded coupling module has said n aspheric lens surfaces integrally molded on its lower surface.

3. The apparatus of claim 1 wherein said fiber optic cable receptacle is integrally molded into said molded coupling module.

4. The apparatus of claim 3 wherein said collimating lens is integrally molded into said molded coupling module.

5. The apparatus of claim 1 wherein said plurality of n filters comprises n discrete Fabry-Perot filters.

6. The apparatus of claim 5 wherein said molded coupling module further comprises an alignment channel formed in its upper surface and wherein said n discrete Fabry-Perot filters are adhesively mounted in said alignment channel.

7. The apparatus of claim 6 wherein said molded coupling module further comprises a filter registration surface extending perpendicularly to said alignment channel, said filter registration surface forming a seat against which said plurality of filters is placed.

8. The apparatus of claim 7 further comprising a plurality of relief cuts formed in said upper surface of said molded coupling module, said relief cuts extending transversely to said alignment channel, said relief cuts adapted to receive adhesive.

9. The apparatus of claim 8 further comprising adhesive having an index of refraction compatible with said molded coupling module, said adhesive covering the entire upper surface of said molded coupling module, the entire lower surface of said optical block, the lower surface of said filters, and completely filling said alignment channel and said relief cuts.

10. An optical wavelength division multiplexer and demultiplexer for single mode or multi-mode fiber optic communication systems, wherein n channels are transmitted through a single fiber optic cable having n different wavelengths and wherein optical couplings, lenses and alignment of the device are achieved by joining of two prefabricated parts together to avoid post-fabrication alignment and adjustment of the optical pathway otherwise required, comprising:

an optical block having a flat upper surface and a flat lower surface, a reflective coating carried by said upper surface of said optical block, a plurality of n discrete Fabry-Perot filters mounted on said flat lower surface of said optical block, said filters adapted to separately filter said n different wavelengths, a monolithic molded coupling module having a flat upper surface on which said flat lower surface of said optical block is mounted, said molded coupling module having a molded fiber optic cable receptacle for receiving the end of said fiber optic cable, said molded coupling module having an integrally molded collimating lens optically aligned with said fiber optic cable receptacle, said molded coupling module also having a lower surface on which a plurality of n aspheric lens surfaces is integrally molded, wherein each of said n aspheric lenses is optically aligned with each of said n Fabry-Perot filters, and said molded coupling module having beam reflecting means formed therein between said collimating lens and said flat upper surface of said molded coupling module to optically align said collimating lens with said plurality of n Fabry-Perot filters, whereby said n channels of light introduced through said fiber optic cable are reflected between said reflective coating on the upper surface of said molded coupling module and said plurality of n discrete Fabry-Perot filters, and wherein each of n channels passes through one of said filters and through one of said n molded aspheric lens surfaces.

11. The apparatus of claim 10 wherein said molded coupling module further comprises an alignment channel formed in its upper surface and wherein said n discrete Fabry-Perot filters are adhesively mounted in said alignment channel.

12. The apparatus of claim 11 wherein said molded coupling module further comprises a filter registration surface extending perpendicularly to said alignment channel, said filter registration surface forming a seat against which said plurality of filters is placed.

13. The apparatus of claim 11 further comprising a plurality of relief cuts formed in said upper surface of said molded coupling module, said relief cuts extending transversely to said alignment channel, said relief cuts adapted to receive adhesive.

14. The apparatus of claim 13 further comprising adhesive having an index of refraction compatible with said molded coupling module, said adhesive covering the entire upper surface of said molded coupling module, the entire lower surface of said optical block, the lower surface of said filters, and completely filling said alignment channel and said relief cuts.

* * * * *